United States Patent
Park

(10) Patent No.: US 7,491,291 B2
(45) Date of Patent: Feb. 17, 2009

(54) APPARATUS FOR TRAPPING RESIDUAL PRODUCTS IN SEMICONDUCTOR DEVICE FABRICATION EQUIPMENT

(75) Inventor: Jin-Jun Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 226 days.

(21) Appl. No.: 11/322,388

(22) Filed: Jan. 3, 2006

(65) Prior Publication Data

US 2006/0162862 A1   Jul. 27, 2006

(30) Foreign Application Priority Data

Jan. 24, 2005   (KR) .................... 10-2005-0006169

(51) Int. Cl.
*C23F 1/00* (2006.01)
*H01L 21/306* (2006.01)

(52) U.S. Cl. ................................ 156/345.29
(58) Field of Classification Search ............. 156/345.29
See application file for complete search history.

(56) References Cited

U.S. PATENT DOCUMENTS

| | | | |
|---|---|---|---|
| 1,940,199 A * | 12/1933 | Wagner | ............... 96/27 |
| 4,506,513 A * | 3/1985 | Max | ............... 62/55.5 |
| 4,892,653 A | 1/1990 | Latge | |
| 5,456,945 A * | 10/1995 | McMillan et al. | ............. 427/252 |
| 5,545,240 A * | 8/1996 | Tsuru et al. | .................. 96/146 |
| 5,810,077 A * | 9/1998 | Nakamura et al. | .......... 165/153 |
| RE36,408 E * | 11/1999 | Yamanaka et al. | ............ 62/509 |
| 6,528,420 B1 | 3/2003 | Tong et al. | |

FOREIGN PATENT DOCUMENTS

WO   WO 00/51702   *   9/2000

* cited by examiner

*Primary Examiner*—Parviz Hassanzadeh
*Assistant Examiner*—Keath Chen
(74) *Attorney, Agent, or Firm*—Volentine & Whitt, PLLC

(57) ABSTRACT

An apparatus traps residual products before the products can be formed in or flow to a vacuum pump in semiconductor device manufacturing equipment. The apparatus is connected between a process chamber and the vacuum pump and includes first and second cooling plates alternately disposed inside a hollow cylindrical housing. The first cooling plates each have a base and a grid projecting from a surface of the base, and define a vent hole extending through a central portion of the base. Each of the second cooling plates have a base and a grid projecting from a surface of the base, and define a plurality of vent holes extending through an outer peripheral portion of the base. Gaseous products flowing from a process chamber and through the housing are transformed into powder that adheres to the cooling plates.

20 Claims, 8 Drawing Sheets

APPARATUS FOR TRAPPING RESIDUAL PRODUCTS IN SEMICONDUCTOR DEVICE FABRICATION EQUIPMENT

BACKGROUND OF THE INVENTION

1. Field of the Invention

The present invention relates to semiconductor device manufacturing equipment. More particularly, the present invention relates to semiconductor device manufacturing equipment having a process chamber, and an exhaust system that evacuates the process chamber and exhausts gaseous products from the process chamber.

2. Description of the Related Art

A semiconductor device is generally fabricated in part by forming a thin film on a substrate, and selectively etching the thin film to form a desired specific pattern on the substrate. These main processes are carried out in a low pressure and high temperature process atmosphere maintained within a so-called process chamber. In particular, the substrate is supported within the process chamber. Then, a reactant gas is injected into the process chamber and an RF power is applied to excite the gas. As a result, a chemical reaction is facilitated that forms a specific thin film on the substrate or etches a thin film that is already present on the substrate. In addition, gaseous products are essentially created as a by-product of the chemical reaction.

As an example, a low pressure chemical vapor deposition (LPCVD) process facilitates a chemical reaction of $Si_2HCl_2$ and $NH_3$ to form a thin film of $Si_3N_4$ on a substrate. The reaction creates $NH_4Cl$ as a gaseous by-product. The by-product remains gaseous in low pressure and high temperature conditions, but tends to transform into powder at a higher pressure and lower temperature.

In particular, a large amount of the gaseous by-product transforms into powder due to an increase in pressure and drop in temperature that occurs while the gaseous by-product is being exhausted from the process chamber by an exhaust system of the LPCVD equipment. The powder is highly adhesive. Therefore, it clings to an exhaust line or a vacuum pump of the exhaust system, thereby causing a drop in the power of the exhaust system.

Accordingly, a cooling trap has been conventionally provided in the exhaust line that connects the process chamber with the vacuum pump of the exhaust system. The cooling trap forcibly cools the gas to transform it into powder that adheres to the cooling trap. This aims to prevent any of the powder from entering or adhering to the vacuum pump.

FIG. 1 illustrates an arrangement in which a cooling trap is applied to conventional semiconductor device fabrication equipment.

As shown in FIG. 1, a cooling trap 4 is provided on an exhaust line 3 that connects a vacuum chamber 1, such as a process chamber, and a vacuum pump 2. The cooling trap 4 defines a passage through which a refrigerant, such as cool water, circulates to forcibly cool any exhaust gas passing through the cooling trap 4, with the aim of solidifying the exhaust gas into powder. Exhaust products solidified in the cooling trap 4 are highly adhesive. Thus, most of the solidified exhaust products cling to the sidewall of the cooling trap 4.

However, the conventional cooling trap 4 fails to transform all of the exhaust gas into a solid by-product. Thus, some of the exhaust gas is introduced into the vacuum chamber 2, where the gas solidifies. As a result, the performance of the exhaust system in exhausting the vacuum chamber 2 is degraded, and the PM (preventative maintenance) of the equipment must be preformed more frequently. This, in turn, lowers the yield and productivity of the fabricating process, and shortens the useful life of the vacuum pump 2.

SUMMARY OF THE INVENTION

An object of the present invention is to solve the foregoing problems of the prior art.

One object of the present invention is to provide an apparatus that prevents pressure loss in a process chamber in which a process is carried out in a vacuum.

Another object of the present invention to provide an apparatus that prevents the introduction of gaseous products, which could solidify, into a vacuum pump in order to prolong the useful life of the vacuum pump.

It is yet another object of the invention to provide an apparatus that minimizes the frequency required for performing PM of equipment for processing a substrate, thereby enhancing the productivity of the equipment.

A more specific object of the present invention is to provide an apparatus for trapping all of the residual products in gas exhausted from a process chamber by a vacuum pump.

In accordance with one aspect, the present invention provides apparatus for trapping residual products, comprising: a housing in the form of a hollow cylinder, and first and second cooling plates alternately disposed within and spaced from each other along the longitudinal axis of the housing. Each of the first cooling plates has a first base extending across the housing and defining a vent hole extending through a central portion of the first base, and a first grid projecting from a surface of the first base. Each of the second cooling plates has a second base extending across the housing and defining a plurality of vent holes extending through an outer peripheral portion of the second base, and a second grid projecting from a surface of the second base.

In accordance with another aspect, the present invention provides processing equipment having a process chamber in which a substrate is processed, and a vacuum pump for exhausting the process chamber of gaseous products created as the result of the processing of the substrate, wherein the apparatus for trapping residual products is interposed between the process chamber and the vacuum pump. The housing of the apparatus has a gas inlet and a gas outlet at opposite ends thereof. A first exhaust line extends from the process chamber to the gas inlet of the housing, and a second exhaust line extends from the gas outlet of the housing to the vacuum pump.

According to another aspect of the present invention, the apparatus also has support members extending within and fixed to the housing, and supporting the first and second cooling plates inside the housing. The support members extend along and project inwardly from the inner peripheral surface of the housing. Preferably, the support members allow the cooling plates to be readily detached from and attached thereto.

According to yet another aspect of the present invention, each of the first and second cooling plates has a cooling passageway extending within and through the base thereof. In this case, a refrigerant feeding pipe extends alongside the housing and is connected to inlets of the cooling passageways, a source of refrigerant is connected to the refrigerant feeding pipe, and a refrigerant exhaust pipe extends alongside the housing and is connected to outlets of the cooling passageways.

According to still another aspect of the present invention, an inert gas feeding line may be connected to the housing. A source of inert gas is connected to the inert gas feeding line such that inert gas can be fed into the housing to increase the pressure therein.

BRIEF DESCRIPTION OF THE DRAWINGS

The above and other objects, features and advantages of the present invention will become more apparent to those of ordinary skill in the art from the following detailed description of the preferred embodiments thereof made with reference to the attached drawings in which.

DETAILED DESCRIPTION OF THE PREFERED EMBODIMENTS

The present invention will now be described with reference to the accompanying drawings, in which preferred embodiments of the invention are shown. Like reference numbers designate like elements throughout the drawings.

Figure 2:
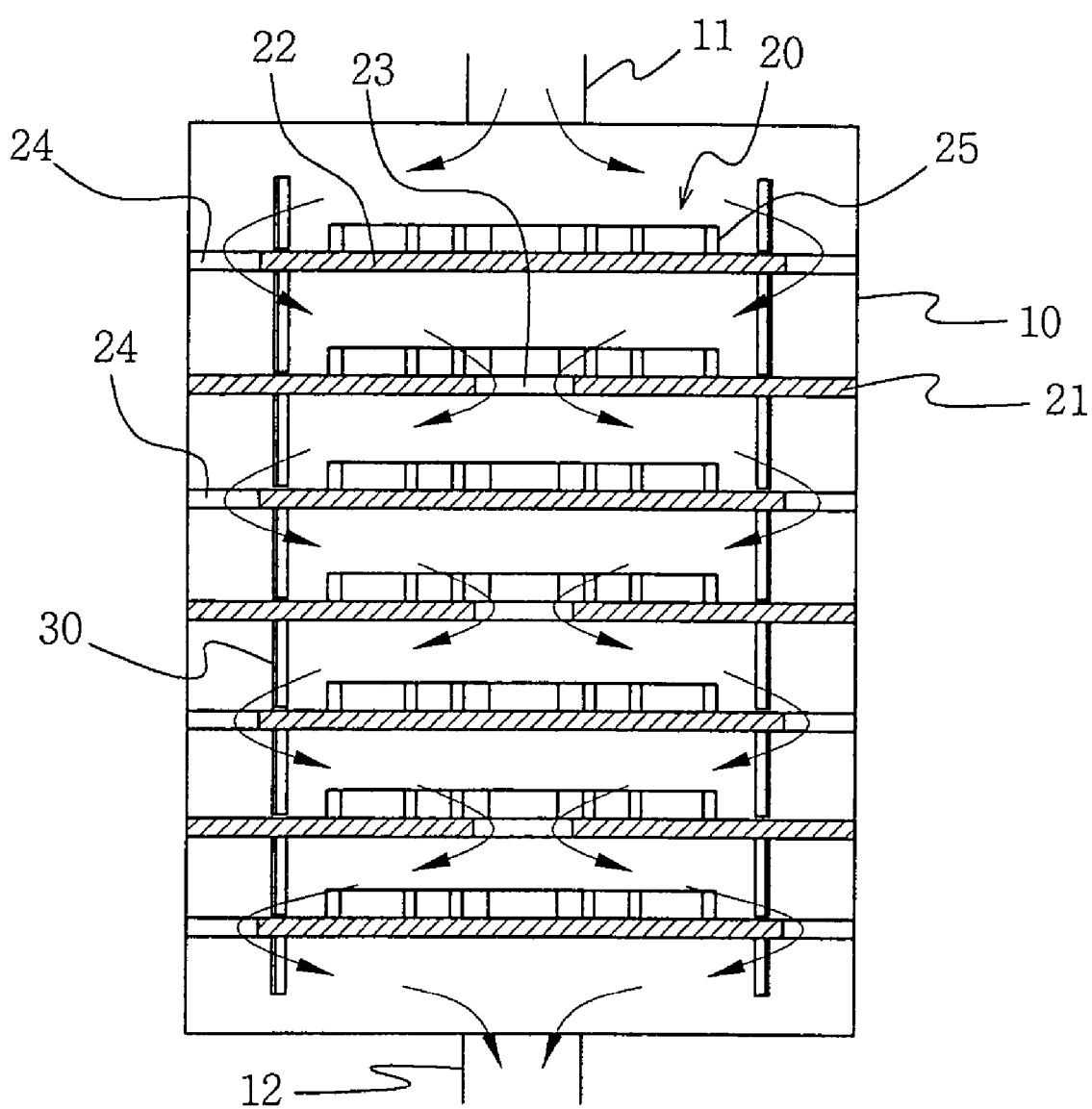
FIG. 2 is a longitudinal sectional view of an embodiment of a cooling trap according to the present invention.

Referring to FIG. 2, a cooling trap according to the present invention generally includes a housing 10, cooling members 20 disposed in the housing 10, and support members 30 that support the cooling members. The housing 10 is hollow and has the shape of a right circular or rectangular cylinder. One end of the housing 10 is connected to an exhaust line 11 leading from a process chamber and the other end of the housing 10 is connected to an exhaust line 12 leading to a vacuum pump.

Figure 3:
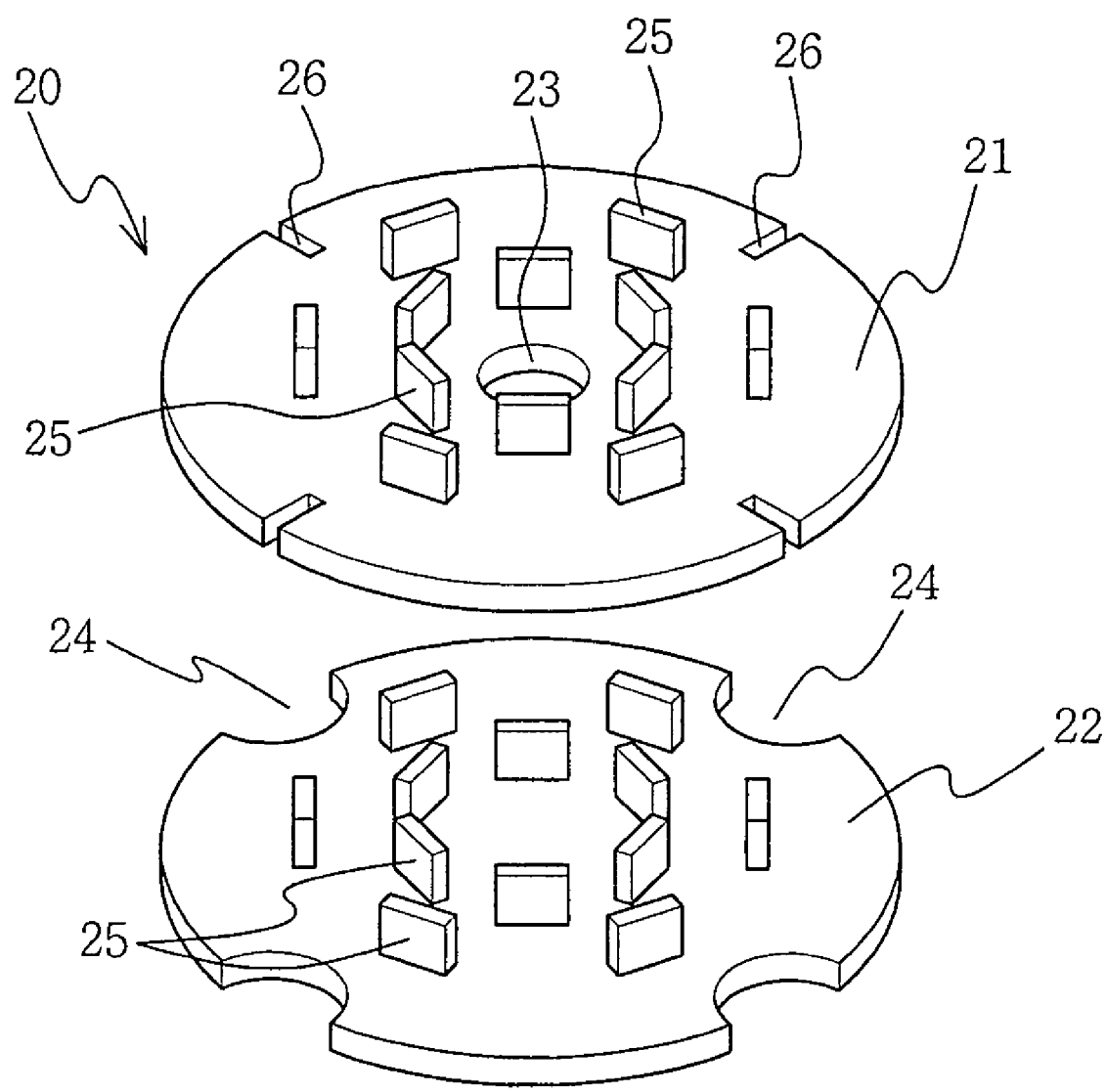
FIG. 3 is a perspective view of an arrangement of cooling members of the cooling trap.

As shown in FIG. 3, the cooling members 20 include first cooling plates 21 and second cooling plates 22. Each of the first and second cooling plates 21 and 22 has a substantially planar base, and a plurality of grid pieces 25 projecting from the base by a predetermined distance and together forming a grid. Also, a vent hole 23 of a predetermined diameter extends through the center of each of the first cooling plates 21. On the other hand, a plurality of vent holes 24, in the form of notches of a predetermined size, are defined at and spaced uniformly along the outer periphery of each of the second cooling plates 22.

Also, the first and second cooling plates 21 and 22 are spaced vertically from each other within the housing 10 as alternately disposed to form a multilayered structure. The spacing between the first and second cooling plates 21 and 22 preferably decreases in a direction from the exhaust line 11 (process chamber side) toward the exhaust line 12 (vacuum pump side) inside the housing 10. The vent holes 24 of the cooling plates 22 can be aligned in the direction in which the first and second cooling plates 21 and 22 are spaced, i.e., along the vertical. Alternatively, the vent holes 24 of at least one of the cooling plates 22 can be horizontally offset from the vent holes 24 of another of the cooling plates 22.

The support members 30 stably support the cooling members 20 inside the housing 10. More specifically, each of the support members 30 extends longitudinally along the side of the housing 10 and is fixed to the housing 10. The support members 30 are also spaced from one another in the circumferential direction of the housing 10. The first and second cooling plates 21 and 22 of the cooling member 20 are, in turn, held by the support members 30 as spaced apart from one another inside the housing 10.

Figure 4:
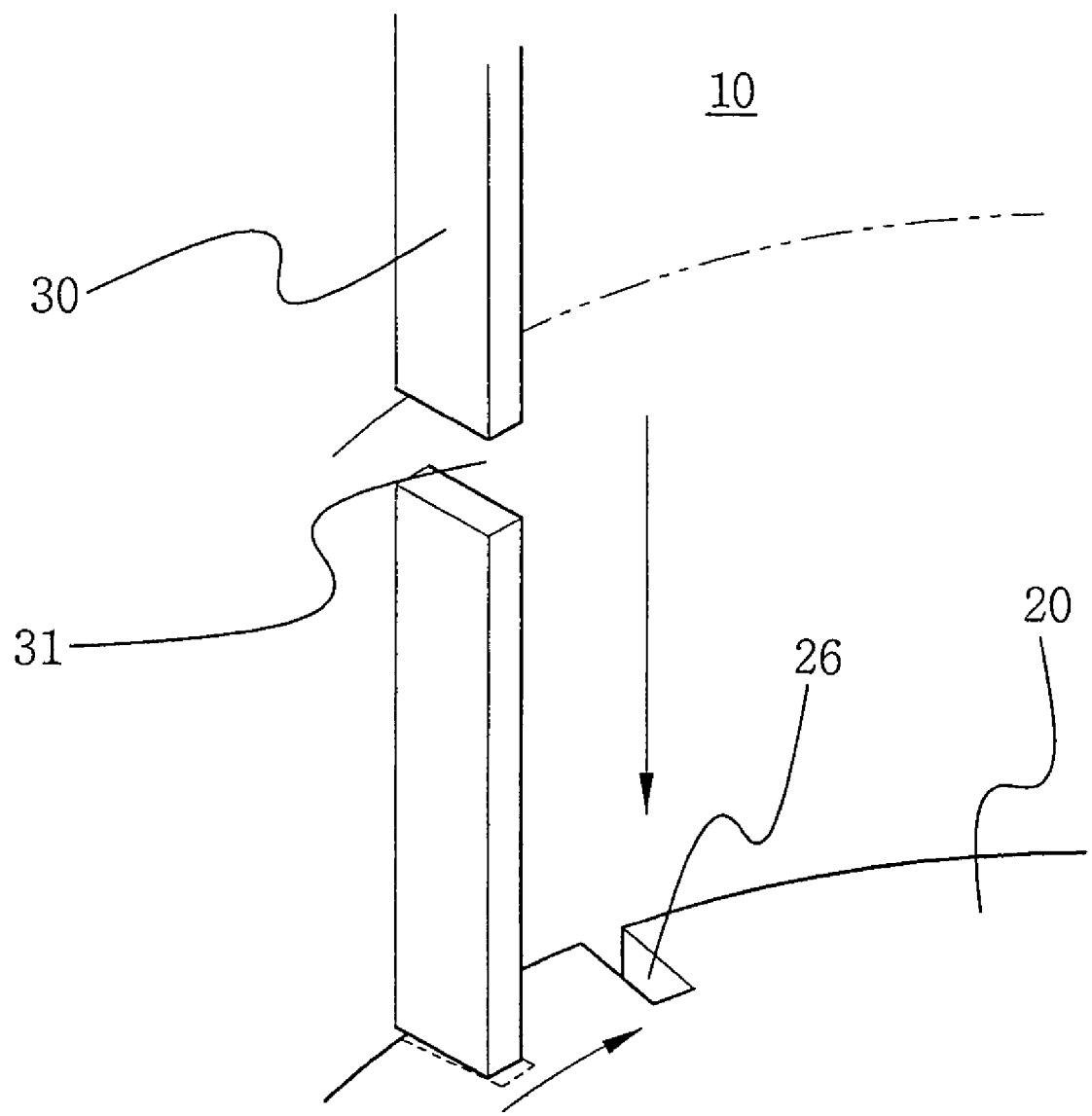
FIG. 4 is an enlarged perspective view of part of the cooling trap according to the present invention, illustrating a cooling member assembled to a support member in a housing of the cooling trap.

More specifically, as shown in FIG. 4, each support member 30 projects inwardly by a small amount from the inner periphery of the housing 10. The support members 30 have cut-outs 31 that are spaced at predetermined intervals along the lengths thereof. The widths of the cut-outs are greater than the thicknesses of the bases of the cooling plates 21 and 22 so that the cooling plates 21 and 22 can be inserted into the cut-outs 31 and supported by the support members 30.

In particular, the support members 30 are preferably provided at locations corresponding to those of the vent holes 24 of the second cooling plates 22. Thus, each second cooling plate 22 can be inserted into the housing 10 with the vent holes 24 aligned with the support members. The second cooling plate 22 is then slid relative to the housing 10 until the base thereof arrives at a desired location where corresponding cut-outs 31 in the support members 30 exist. Then the second cooling plate 22 is rotated such that the base thereof is received in the cut-outs 31, whereby the second cooling plate 22 is supported by the support members 30. On the other hand, each first cooling plate 21 is preferably provided with guide slots 26 at the outer periphery thereof. The guide slots 26 allow the support members 30 to pass therethrough so that the first cooling plates 21 can be assembled similarly to the second cooling plates 22.

Figure 1:
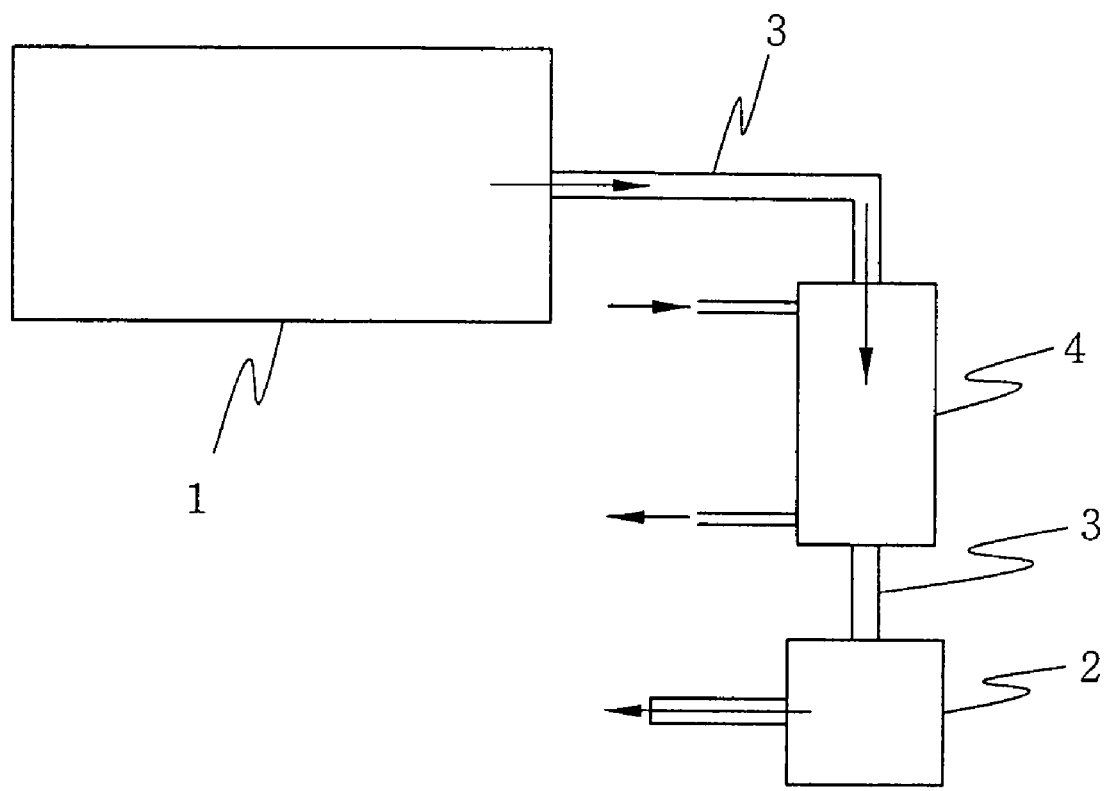
FIG. 1 is a schematic diagram of conventional semiconductor device fabricating equipment.
Figure 5:
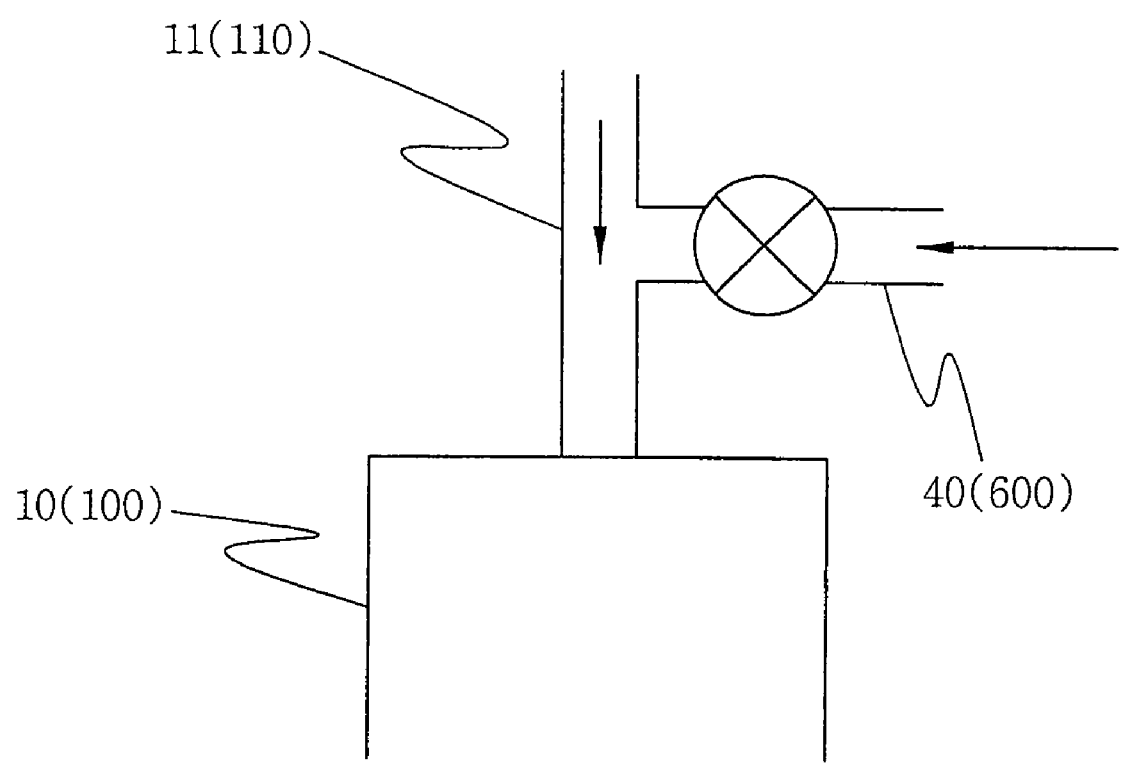
FIG. 5 is a block diagram of a portion of the exhaust system of fabricating equipment according to the present invention, illustrating a feeding line connected to the housing of the cooling trap.

The cooling trap having the above-described structure is provided between a process chamber and a vacuum pump as can be appreciated from FIG. 1 and the description thereof in connection with the prior art. In addition, as shown in FIG. 5, an inert gas feeding line 40 can be connected to a leading end of the housing 10 or to the exhaust line 11 leading from the process chamber. Accordingly, an inert gas such as $N_2$, He or Ar can be introduced into the housing 10 along with the gas exhausted from the process chamber to increase the pressure in the housing 10.

Figure 6:
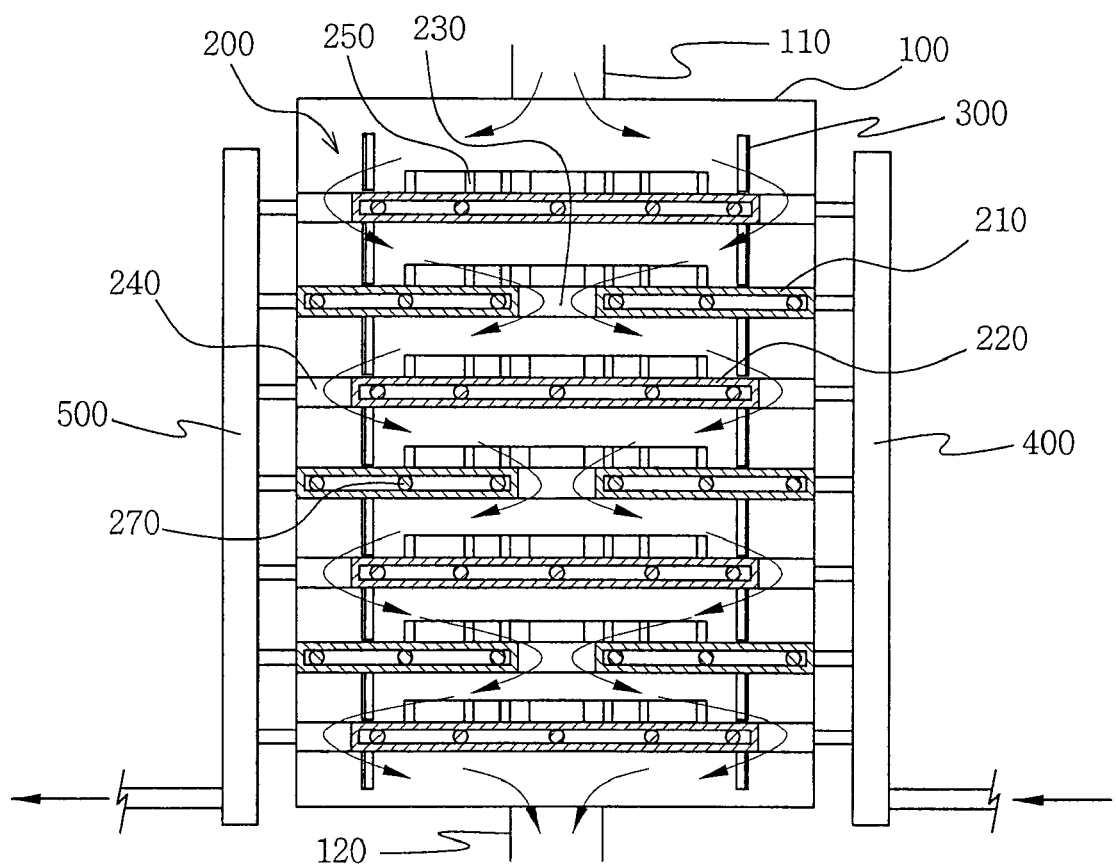
FIG. 6 is a longitudinal sectional view of another embodiment of a cooling trap according to the present invention.

FIG. 6 illustrates another embodiment of the cooling trap of the present invention, which generally includes a housing 100, cooling members 200 disposed in the housing 100, support members 300 that support the cooling members 200 within the housing 100, a refrigerant feeding pipe 400 through which refrigerant is fed to the cooling members 200, and a refrigerant exhaust pipe 500 through which refrigerant is discharged from the cooling members 200.

The housing 100 has a configuration substantially the same as that of the above-described embodiment. That is, the housing 100 is hollow and has the shape of a right circular or square cylinder. One end of the housing 100 is connected to an exhaust line 110 leading from a process chamber, and the other end of the housing 100 is connected to an exhaust line 120 leading to a vacuum pump.

The cooling members 200 include first and second cooling plates 210 and 220. Each of the cooling plates 210 and 22 has a base in the form of a hollow disk, and a plurality of grid pieces 250 projecting from the top of the base and together forming a grid. Also, a vent hole 230 of a predetermined diameter extends through the center of the base of each of the first cooling plates 210. On the other hand, a plurality of vent holes 240, in the form of notches of a predetermined size, are defined at and spaced uniformly along the outer periphery of each of the second cooling plates 220.

Also, the first and second cooling plates 210 and 220 are spaced vertically from each other within the housing 100 as alternately disposed to form a multilayered structure. The spacing between the first and second cooling plates 210 and 220 preferably decreases in a direction from the exhaust line 110 (process chamber side) toward the exhaust line 120 (vacuum pump side) inside the housing 100. The vent holes 240 of the cooling plates 220 can be aligned in the direction in which the first and second cooling plates 210 and 220 are spaced, i.e., along the vertical. Alternatively, the vent holes 240 of at least one of the cooling plates 22 can be horizontally offset from the vent holes 240 of another of the cooling plates 220.

Figure 7:
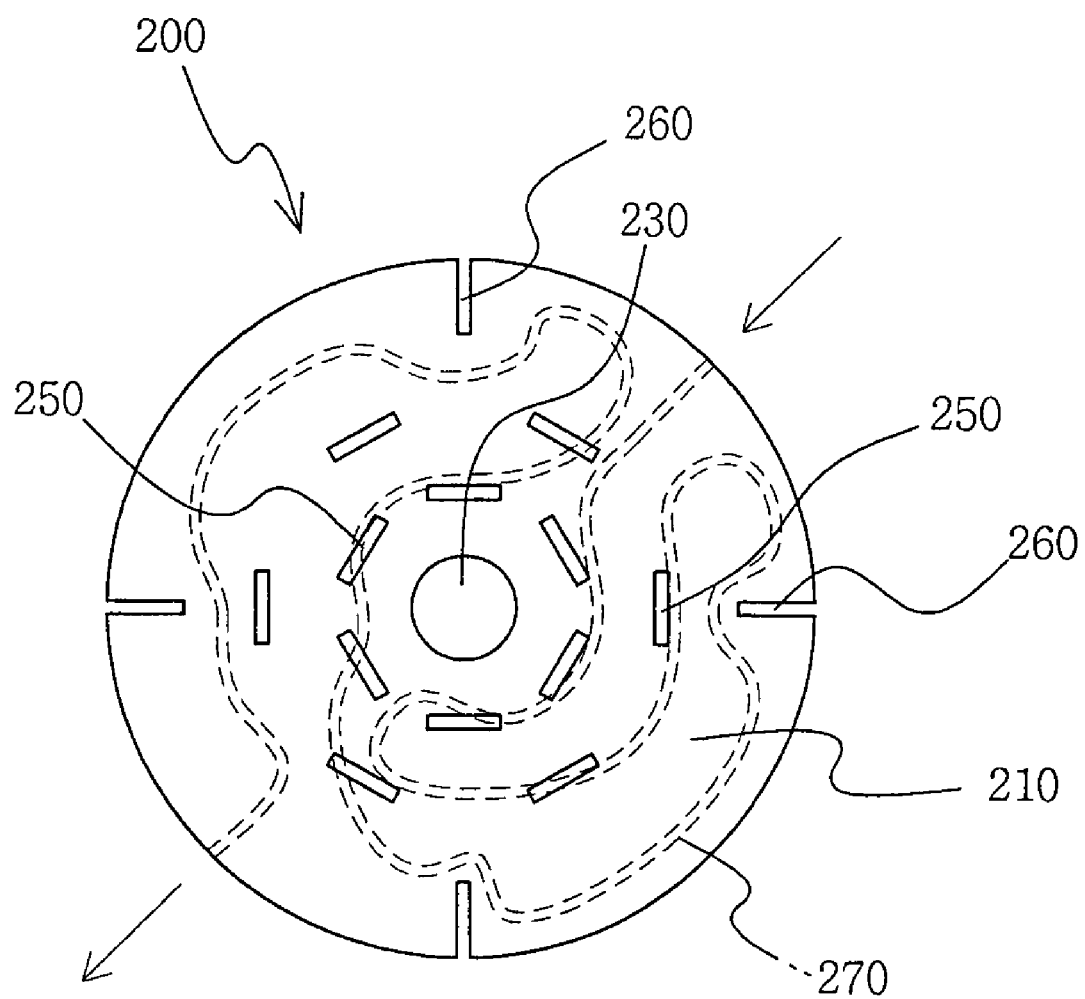
FIGS. 7 and 8 are plan views of cooling members of the cooling trap shown in FIG. 6.
Figure 8:
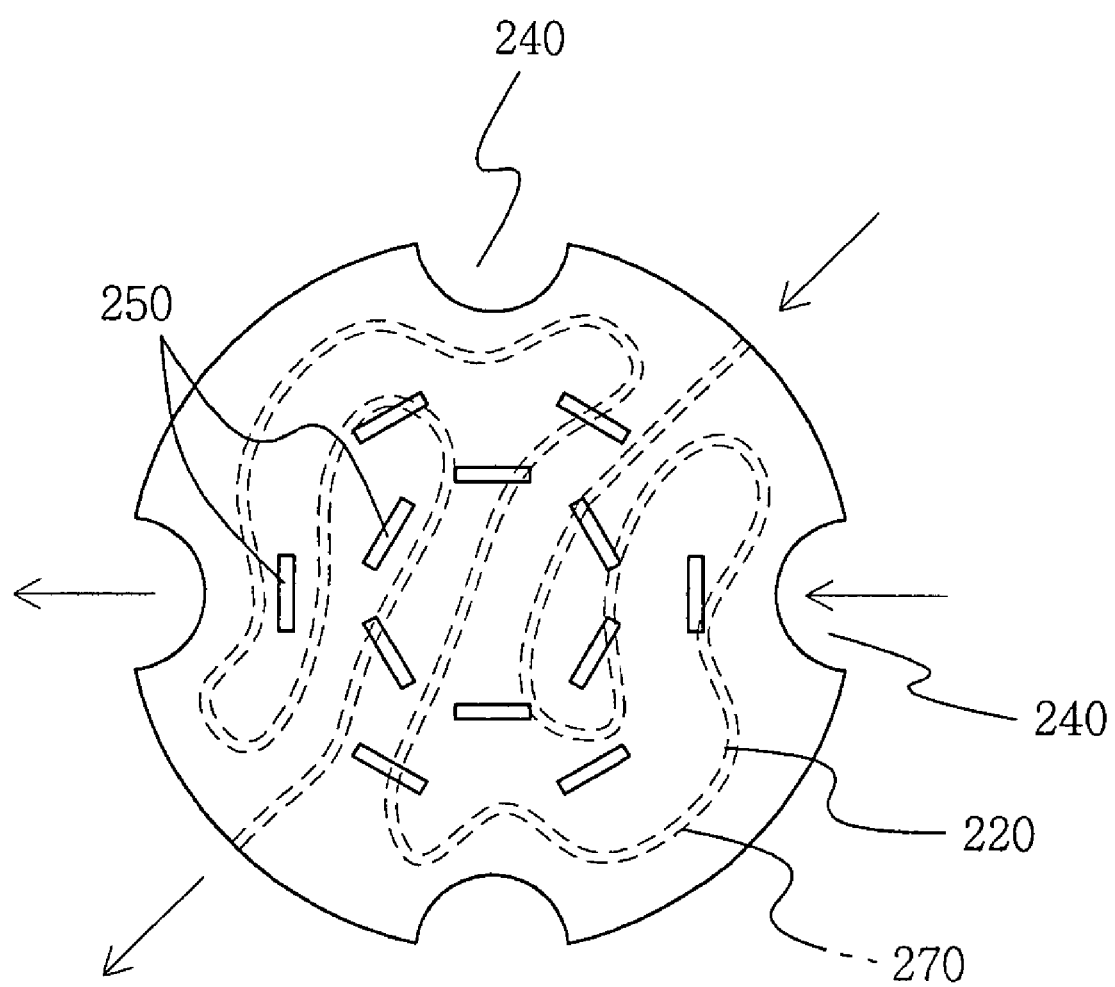

However, unlike the cooling members 20 of foregoing embodiment, the cooling members 200 of this embodiment include cooling pipes 270 to uniformly facilitate the cooling of upper and lower surfaces of the cooling members 200. In particular, cooling pipes 270 are disposed inside the hollow bases of the first and second cooling plates 210 and 220, respectively. Each cooling pipe 270 is in close contact with top and bottom plates of the base of cooling plate in which it is disposed. Also, each cooling pipe 270 has a refrigerant inlet and a refrigerant outlet disposed opposite to each other about the base of the cooling plate in which it is disposed, as shown in FIGS. 7 and 8.

The support members 300 stably support the cooling members 200 inside the housing 100. More specifically, each of the support members 300 extends longitudinally along the side of the housing 100 and is fixed to the housing 100. The support members 300 are also spaced from one another in the circumferential direction of the housing 100. The first and second cooling plates 210 and 220 of the cooling member 200 are, in turn, held by the support members 300 as spaced apart from one another inside the housing 100.

Each of the support members 300 projects inwardly by a small amount from the inner periphery of the housing 100. The support members 300 have cut-outs 310 that are spaced at predetermined corresponding intervals along the lengths thereof. The widths of the cut-outs 310 are greater than the thicknesses of the hollow disk-like bases of the cooling plates 210 and 220 so that the cooling plates 210 and 220 can be inserted into the cut-outs 310 and supported by the support members 300.

In particular, each first cooling plate 210 is preferably provided with guide slots 260 at the outer periphery thereof. The guide slots 260 allow the support members 300 to pass therethrough so that the first cooling plates 210 can be assembled to the support members 300. On the other hand, the vent holes 240 at the outer periphery of the second cooling plates 220 allow the second cooling plates 220 to be assembled to the support members 300.

The refrigerant feeding pipe 400 and the refrigerant exhaust pipe 500 are disposed on opposite sides of the housing 100 outside the housing 100. The refrigerant feeding pipe 400 and the refrigerant exhaust pipe 500 are connected to the refrigerant inlet and refrigerant outlet of each of the cooling pipes 270, respectively. Refrigerant such as water, freon or the like is fed from the refrigerant feeding pipe 400 through the cooling pipes 270 and to the refrigerant exhaust pipe 500.

Also, as was the case with the first embodiment, an inert gas feeding line 600 (FIG. 5) can be connected to a leading end of the housing 100 or to the exhaust line 110 leading from the process chamber. Accordingly, an inert gas such as $N_2$, He or Ar can be introduced into the housing 100 along with the gas exhausted from the process chamber to raise the pressure in the housing 100.

The present invention is devised to substantially transform the gaseous products exhausted from the process chamber into powder by providing a low temperature atmosphere for the gaseous products. The powder thus formed will adhere to the cooling members 20, 200 inside the housing 10, 100, thereby preventing powder from forming in or flowing into the exhaust line 12, 120 and the vacuum pump.

The invention operates as follows.

Various gaseous products are exhausted from the process chamber through the exhaust line 11, 110 by the operation of the vacuum pump. The gaseous products are introduced into the housing 10, 100 via the exhaust line 11, 110. Once inside the housing 10, 100, the gaseous products contact and undergo a heat exchange with the cooling members 20, 200 stacked inside the housing 10, 100, as shown in FIG. 2 or 6.

Specifically, gaseous products introduced into the housing 10, 100 pass through the first cooling plates 21, 210 and the second cooling plates 22, 220. That is, the gaseous products flow alternatingly along the outer portion of the interior of the housing 10, 100 and the central portion of the interior of the housing 10, 100 via the vent holes 23, 230 of the first cooling plates 21, 210 and the vent holes 24, 240 of the second cooling plates 22, 220. Also, the gaseous products collide against the grid pieces 25, 250 while passing through the first cooling plates 21, 210 and second cooling plates 22 220.

Therefore, the gaseous products introduced into the housing 10, 100 contact and undergo a heat exchange with the first and second cooling plates 21, 210 and 22, 220 inside the housing 10, 100. In the second embodiment, the gaseous products are rapidly cooled by refrigerant flowing through the cooling pipes 270 enclosed in the bases of the first and second cooling plates 210 and 220.

This transforms the gaseous products into powder, which is highly adhesive, inside the housing 10, 100. The powder thus clings to the first cooling plates 21, 210 and the second cooling plates 22, 220. Then, any remaining gas is exhausted to the outside via the exhaust line 12, 120. Furthermore, according to the invention, inert gas such as $N_2$, He or Ar is fed through the feeding line 40, 600 into the housing 10, 100 to raise the pressure inside the housing 10, 100 and thus more promote the solidification of the gaseous products.

As described above, the present invention prevents those gaseous products which could solidify from flowing into or adjacent the vacuum pump. Thus, the present invention prevents vacuum pressure loss due to clogs in the vacuum pump or the line leading into the vacuum pump. Also, the PM of the equipment can be performed less frequently. Therefore, the invention can lead to increases in the yield of the process carried out in the process chamber, enhance the efficiency of the process as well, and prolong the useful life of the vacuum pump.

Furthermore, the cooling trap of the present invention can be easily cleaned at the time the PM of the equipment is performed. In particular, according to the invention, the housing 10, 100 can be opened and the first cooling plates 21, 210 and the second cooling plates 22, 220 to which most of the powder adheres can be easily detached from the support members 30, 300. As a result, the first cooling plates 21, 210 and the second cooling plates 22, 220 can be removed from inside the housing 10, 100 and thoroughly cleaned.

Although a number of details have been described in the above, they are to be understood merely as an example of preferred embodiments rather than defining the scope of the invention.

Finally, although the present invention has been described above in connection with the preferred embodiments, the scope of the invention is not so limited. On the contrary, various modifications of the preferred embodiments will be apparent to persons skilled in the art. Therefore, the true spirit and scope of the invention is not limited to the disclosed embodiments but by the appended claims.

What is claimed is:

1. Apparatus for trapping residual products in gas in an exhaust system, comprising:

a housing in the form of a hollow cylinder, and having a gas inlet and a gas outlet at opposite ends thereof; and first and second cooling plates alternately disposed within the housing in the direction of the longitudinal axis of the housing, each of the first cooling plates having a first base and a plurality of concentric first grid members, the first base extending across the housing and defining a circular vent hole which extends through a central portion of the first base and is open to with the interior of the housing, and the plurality of concentric first grid members projecting from a surface of the first base at locations radially outwardly of the vent hole, and each of the second cooling plates having a second base and a plurality of concentric second grid members, the second base extending across the housing and defining a plurality of vent holes which extend through an outer peripheral portion of the second base and are open to the interior of the housing, and the plurality of concentric second grid members projecting from a surface of the second base at locations radially inwardly of the plurality of vent holes.

2. The apparatus for trapping residual products according to claim 1, and further comprising support members extending within and fixed to the housing, and supporting the first and second cooling plates inside the housing.

3. The apparatus for trapping residual products according to claim 2, wherein the support members extend along and project inwardly from the inner peripheral surface of the housing.

4. The apparatus for trapping residual products according to claim 2, wherein the support members are spaced from each other in the circumferential direction of the housing by intervals equal to intervals by which the vent holes of each of the second cooling plates are spaced from each other along the outer peripheral portion of the base thereof.

5. The apparatus for trapping residual products according to claim 1, wherein the spacing between the first and second cooling plates decreases in the housing in a direction from the gas inlet to the gas outlet of the housing.

6. The apparatus for trapping residual products according to claim 1, wherein each of the first and second cooling plates has a cooling passageway extending within and through the base thereof.

7. The apparatus for trapping residual products according to claim 1, wherein the grid members of each of the cooling plates comprise discrete plates that are spaced from one another across the base of the cooling plate.

8. The apparatus for trapping residual products according to claim 7, wherein the discrete plates are arrayed along at least one circle intermediate the center and the outer peripheral portion of the base of the cooling plate.

9. The apparatus for trapping residual products according to claim 1, wherein the cooling plates are spaced from each other along the longitudinal axis of the housing with the grid members of respective ones of the cooling plates projecting toward and spaced from the base of the cooling plate adjacent thereto.

10. Processing equipment for processing a substrate using gas, said equipment comprising:

a process chamber in which a substrate is processed, the process chamber having an exhaust outlet;

a first exhaust line connected to the exhaust outlet of the process chamber so as to lead from the process chamber;

a vacuum pump;

a second exhaust line leading to the vacuum pump; and apparatus for trapping residual products, the apparatus comprising a housing in the form of a hollow cylinder, and having a gas inlet and a gas outlet at opposite ends thereof, the first exhaust line extending from the process chamber to the gas inlet, and the second exhaust line extending from the gas outlet to the vacuum pump, whereby the vacuum pump is connected to the process chamber through the interior of the housing, and first and second cooling plates alternately disposed within the housing in the direction of the longitudinal axis of the housing, each of the first cooling plates having a first base and a plurality of concentric first grid members, the first base extending across the housing and defining a circular vent hole which extends through a central portion of the first base and is open to the interior of the housing, and the plurality of concentric first grid members projecting from a surface of the first base at locations radially outwardly of the vent hole, and each of the second cooling plates having a second base and a plurality of concentric second grid members, the second base extending across the housing and defining a plurality of vent holes which extend through an outer peripheral portion of the second base and are open to the interior of the housing, and the plurality of concentric second grid members projecting from a surface of the second base at locations radially inwardly of the plurality of vent holes.

11. The processing equipment according to claim 10, wherein the apparatus further comprises support members extending within and fixed to the housing, and supporting the first and second cooling plates inside the housing.

12. The processing equipment according to claim 11, wherein the support members extend along and project inwardly from the inner peripheral surface of the housing.

13. The processing equipment according to claim 12, wherein the support members are spaced from each other in the circumferential direction of the housing by intervals equal to intervals by which the vent holes of each of the second cooling plates are spaced from each other along the outer peripheral portion of the base thereof.

14. The processing equipment according to claim 10, wherein the spacing between the first and second cooling plates of the apparatus decreases in the housing in a direction from the gas inlet to the gas outlet of the housing.

15. The processing equipment according to claim 10, and further comprising an inert gas feeding line connected to the housing, and a source of inert gas connected to the inert gas feeding line such that inert gas can be fed into the housing to increase the pressure therein.

16. The processing equipment according to claim 10, wherein each of the first and second cooling plates has a cooling passageway extending within and through the base thereof, each of the cooling passageways having an inlet and an outlet.

17. The processing equipment according to claim 16, and further comprising a refrigerant feeding pipe extending alongside the housing and connected to the inlets of the cooling passageways of the first and second cooling plates, a source of refrigerant connected to the refrigerant feeding pipe, and a refrigerant exhaust pipe extending alongside the housing and connected to the outlets of the cooling passageways of the first and second cooling plates.

18. The processing equipment according to claim 10, wherein the grid members of each of the cooling plates of the apparatus comprise discrete plates that are spaced from one another across the base of the cooling plate.

19. The processing equipment according to claim 18, wherein the discrete plates are arrayed along at least one circle intermediate the center and the outer peripheral portion of the base of the cooling plate.

20. The processing equipment according to claim 10, wherein the cooling plates of the apparatus are spaced from each other along the longitudinal axis of the housing with the grid members of respective ones of the cooling plates projecting toward and spaced from the base of the cooling plate adjacent thereto.

* * * * *